United States Patent
Lee et al.

(10) Patent No.: US 11,194,153 B2
(45) Date of Patent: Dec. 7, 2021

(54) PHASE SHIFT DEVICE INCLUDING METAL-DIELECTRIC COMPOSITE STRUCTURE

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Jeongyub Lee, Yongin-si (KR); Reehyang Kim, Daejeon (KR); Jonghwa Shin, Daejeon (KR); Kiyeon Yang, Seoul (KR); Yongsung Kim, Suwon-si (KR); Jaekwan Kim, Hwaseong-si (KR); Changseung Lee, Yongin-si (KR); Narae Han, Suwon-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 381 days.

(21) Appl. No.: 16/421,857

(22) Filed: May 24, 2019

(65) Prior Publication Data
US 2020/0192086 A1    Jun. 18, 2020

(30) Foreign Application Priority Data
Dec. 17, 2018 (KR) .................... 10-2018-0163314

(51) Int. Cl.
*G02B 27/00* (2006.01)
*G02B 1/00* (2006.01)
(Continued)

(52) U.S. Cl.
CPC ......... *G02B 27/0025* (2013.01); *G02B 1/002* (2013.01); *G02B 3/02* (2013.01); *G02B 5/0825* (2013.01)

(58) Field of Classification Search
None
See application file for complete search history.

(56) References Cited

U.S. PATENT DOCUMENTS 6,665,119 B1 * 12/2003 Kurtz .................. G02B 5/3058
353/20
7,444,054 B2   10/2008 Challener
(Continued)

FOREIGN PATENT DOCUMENTS

EP    3 392 701 A2    10/2018
GB    2528682 A       2/2016
(Continued)

OTHER PUBLICATIONS

Communication dated Jan. 27, 2020, issued by the European Patent Office in counterpart European Application No. 19178751.4.
(Continued)

*Primary Examiner* — Derek S. Chapel
(74) *Attorney, Agent, or Firm* — Sughrue Mion, PLLC

(57) ABSTRACT

Provided in a phase shifting device including a plurality of metal layers and a plurality of first dielectric layers, a metal layer of the plurality of metal layers and a first dielectric layer of the plurality of first dielectric layers being alternately stacked in a first direction, and a second dielectric layer disposed on a side surface of the stacked structure in a second direction, wherein the first dielectric layer includes a first material having a first dielectric constant and the second dielectric layer includes a second material having a second dielectric constant, and wherein the second dielectric constant is greater than the first dielectric constant.

30 Claims, 13 Drawing Sheets

(51) Int. Cl.
*G02B 3/02* (2006.01)
*G02B 5/08* (2006.01)

(56) References Cited

U.S. PATENT DOCUMENTS

| | | | | |
|---|---|---|---|---|
| 8,373,928 B2* | 2/2013 | Ha | ....................... | G02B 5/3058 |
| | | | | 359/485.05 |
| 9,632,223 B2* | 4/2017 | Probst | .................... | C23F 17/00 |
| 9,778,558 B2 | 10/2017 | Son et al. | | |
| 2004/0125449 A1* | 7/2004 | Sales | .................... | G02B 5/3058 |
| | | | | 359/485.05 |
| 2008/0088932 A1 | 4/2008 | Cho et al. | | |
| 2013/0342915 A1 | 12/2013 | Min et al. | | |
| 2014/0211072 A1 | 7/2014 | Kokubun | | |
| 2017/0338567 A1* | 11/2017 | Puscasu | ............. | H01Q 15/0013 |
| 2018/0156949 A1 | 6/2018 | Tsai et al. | | |

FOREIGN PATENT DOCUMENTS

| | | | |
|---|---|---|---|
| KR | 10-2016-0119310 A | 10/2016 | |
| WO | 2009/011439 A1 | 1/2009 | |
| WO | 2016/073537 A1 | 5/2016 | |

OTHER PUBLICATIONS

Aieta, F., et al., "Multiwavelength achromatic metasurfaces by dispersive phase compensation", Mar. 20, 2015, Science, vol. 347, Issue 6228, p. 1342-1346, 5 pages total.

Arbabi, E., et al., "Multiwavelength metasurfaces through spatial multiplexing", Sep. 6, 2016, www.Nature.com/Scientfic Reports, 8 pages total.

Chang, T., et al., "Broadband giant-refractive-index material based on mesoscopic space-filling curves", Aug. 30, 2016, Nature Communications, 7 pages total.

Kim, J., et al., "Highly tunable refractive index visible-light metasurface from block copolymer self-assembly", Sep. 29, 2016, Nature Communications, 9 pages total.

Yim, K., et al., "Novel high-k dielectrics for next-generation electronic devices screened by automated ab initio calculations", 2015, NGP Asia Materials, 6 pages total.

Khorasaninejad, M., et al., "Achromatic Metasurface Lens at Telecommunication Wavelengths", Jul. 13, 2015, NANO Letters, p. 5358-5362, 5 pages total.

* cited by examiner

PHASE SHIFT DEVICE INCLUDING METAL-DIELECTRIC COMPOSITE STRUCTURE

CROSS-REFERENCE TO RELATED APPLICATION

This application claims priority from Korean Patent Application No. 10-2018-0163314, filed on Dec. 17, 2018 in the Korean Intellectual Property Office, the disclosure of which is incorporated herein in its entirety by reference.

BACKGROUND

1. Field

Example embodiments of the present disclosure relate to a phase shifting device, and more particularly, to a phase shifting device including a metal-dielectric composite structure having a substantially constant refractive index in a wide wavelength band.

2. Description of the Related Art

An optical device with unique electrical and optical properties that cannot be found in nature by using an array of dielectric structures having a wavelength that is less than the wavelength of light may be provided. For example, by using such optical properties, a lens, a beam deflector, a hologram element, and the like having a very small thickness and a small size may be realized.

Optical devices having an array of dielectric structures having a wavelength that is less than the wavelength of light, however, typically have wavelength dependence. Therefore, desired optical properties may be obtained only in a relatively narrow wavelength band. For example, since a lens using such optical properties has a relatively large chromatic aberration, separate optical members to compensate for the chromatic aberration are used together with a lens.

Furthermore, in order to manufacture such an optical device, a material having a high refractive index at a wavelength of corresponding light is used. For example, silicon (Si) having a refractive index of at least 3.5 is mainly used in an infrared band of a wavelength of 1550 nm. However, a single material that maintains a high refractive index and a constant refractive index in a visible light or near infrared region does not exist in nature.

SUMMARY

One or more example embodiments provide a phase shifting device including a metal-dielectric composite structure having a substantially constant refractive index in a wide wavelength band.

Additional aspects will be set forth in part in the description which follows and, in part, will be apparent from the description, or may be learned by practice of example embodiments.

According to an aspect of an example embodiment, there is provided a phase shifting device including a stacked structure including a metal layer and a first dielectric layer, the metal layer and the first dielectric layer being alternately stacked in a first direction, and a second dielectric layer disposed on a side surface of the stacked structure in a second direction, wherein the first dielectric layer includes a first material having a first dielectric constant and the second dielectric layer includes a second material having a second dielectric constant, and wherein the second dielectric constant is greater than the first dielectric constant.

The stacked structure may include at least two metal layers, and wherein a first dielectric layer may be disposed between the two metal layers.

The phase shifting device may further include an oxide layer disposed between the side surface of the stacked structure and the second dielectric layer.

A sum of a width of the stacked structure and a width of the second dielectric layer may be less than a wavelength of incident light.

A sum of a width of the stacked structure and a width of the second dielectric layer may be less than ⅓ of a wavelength of incident light.

A width of the stacked structure may be equal to or greater than a width of the second dielectric layer.

The phase shifting device may further include a plurality of stacked structures and a plurality of second dielectric layers disposed between the plurality of stacked structures.

Each of the plurality of stacked structures and each of the plurality of second dielectric layers may extend in a third direction, and the plurality of stacked structures and the plurality of second dielectric layers may be alternately disposed in the second direction respectively perpendicular to the first direction and the third direction.

The plurality of stacked structures may include a first stacked structure and a second stacked structure that are different from each other in at least one of a width of the metal layer, a thickness of the metal layer, and a thickness of the first dielectric layer.

Widths of the plurality of stacked structures may gradually increase or decrease in the second direction.

The phase shifting device may have a first resonance wavelength band based on surface plasmon resonance at an interface between the metal layer and the first dielectric layer and a second resonance wavelength band based on magnetic resonance between metal layers of adjacent two stacked structures, and wherein the phase shifting device may have a refractive index of 4 or more in a wavelength band between the first resonance wavelength band and the second resonance wavelength band.

A difference between a refractive index of the first resonance wavelength band and a refractive index of the second resonance wavelength band may be 0.3 or less.

The phase shifting device may include a plurality of stacked structures that are two-dimensionally disposed, and wherein the second dielectric layer may have a lattice shape surrounding side surfaces of the plurality of stacked structures.

A horizontal cross-section of each of the stacked structures may have one of a rectangular shape, hexagonal shape, circular shape, or polygonal shape.

The plurality of stacked structures may include a first stacked structure and a second stacked structure that are different from each other in at least one of a width of the metal layer, a thickness of the metal layer, and a thickness of the first dielectric layer.

The stacked structures disposed at different positions may have different widths or thicknesses, and wherein the phase shifting device may have different refractive indices based on positions of the stacked structures in the phase shifting device.

The stacked structures having different widths or thicknesses are disposed such that the phase shifting device may be a symmetrical planar lens or an asymmetric planar aspheric lens.

Widths of the plurality of stacked structures may gradually increase or decrease from a center of the phase shifting device to an edge of the phase shifting device.

A thickness of the metal layer may range from 5 nm to 20 nm.

A thickness of the first dielectric layer may range from 2.5 nm to 15 nm.

A sum of a thickness of one metal layer and a thickness of one first dielectric layer may be 30 nm or less.

A width of the stacked structure may range from 30 nm to 110 nm.

A width of the second dielectric layer may range from 20 nm to 50 nm, and wherein a sum of a width of the stacked structure and a width of the second dielectric layer may range from 50 nm to 200 nm.

A first dielectric constant of the first dielectric layer may be less than 20 and a second dielectric constant of the second dielectric layer is greater than 30.

The first dielectric layer may include at least one of $SiO_2$, $Al_2O_3$, $Si_3N_4$, $Na_2SO_4$, $Sr_3(PO_4)_2$, $YAlO_3$, $MgSiO_3$, $YOCl$, $CaB_4O_7$, $Al_2MgO_4$, $Ba_2SiO_4$, $B_2O_3$, $Mg_4O_3(OH)_2$, $Ba_3P_4O_{13}$, $Li_3OBr$, $Mg(OH)_2$, $Y_2(Si_2O_7)$, $AlLiO_2$, $YOF$, $Ba_3(PO_4)_2$, $SrB_4O_7$, $BaSO_4$, and poly(methyl methacrylate).

The second dielectric layer may include at least one of $TiO_2$, $HfO_2$, $ZrO_2$, $ZnO$, $SrTiO_3$, $GaN$, $GaP$, $BeO$, $NbOCl_3$, $NaNbO_3$, $NaTaO_3$, $AgTaO_3$, $Li_4CO_4$, $CdTiO_3$, $KTaO_3$, $Y_2Ti_2O_7$, $Cd_2Ta_2O_7$, $PbHfO_3$, $AlO(OH)$, $SrHfO_3$, $Ag_2Ta_4O_{11}$, $BaZrO_3$, $PbZrO_3$, $NaIO_3$, $BiTaO_4$, $HfTe_3O_8$, $K_2W_2O_7$, and $Sr_2Ta_2O_7$.

The metal layer may include at least one of aluminum (Al), silver (Ag), gold (Au), and copper (Cu).

According to an aspect of an example embodiment, there is provided a chromatic aberration optical device including a phase shifting device, wherein the phase shifting device includes a stacked structure including a metal layer and a first dielectric layer, the metal layer and the first dielectric layer being alternately stacked in a vertical direction, and a second dielectric layer disposed on a side surface of the stacked structure in a horizontal direction, wherein the first dielectric layer includes a material having a first dielectric constant and the second dielectric layer includes a material having a second dielectric constant, and wherein the second dielectric constant is greater than the first dielectric constant.

The chromatic aberration optical device of claim 28 may be configured as a flat lens or a flat beam deflector in a visible light or near infrared region.

A first dielectric constant of the first dielectric layer may be less than 20 and a second dielectric constant of the second dielectric layer is greater than 30.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
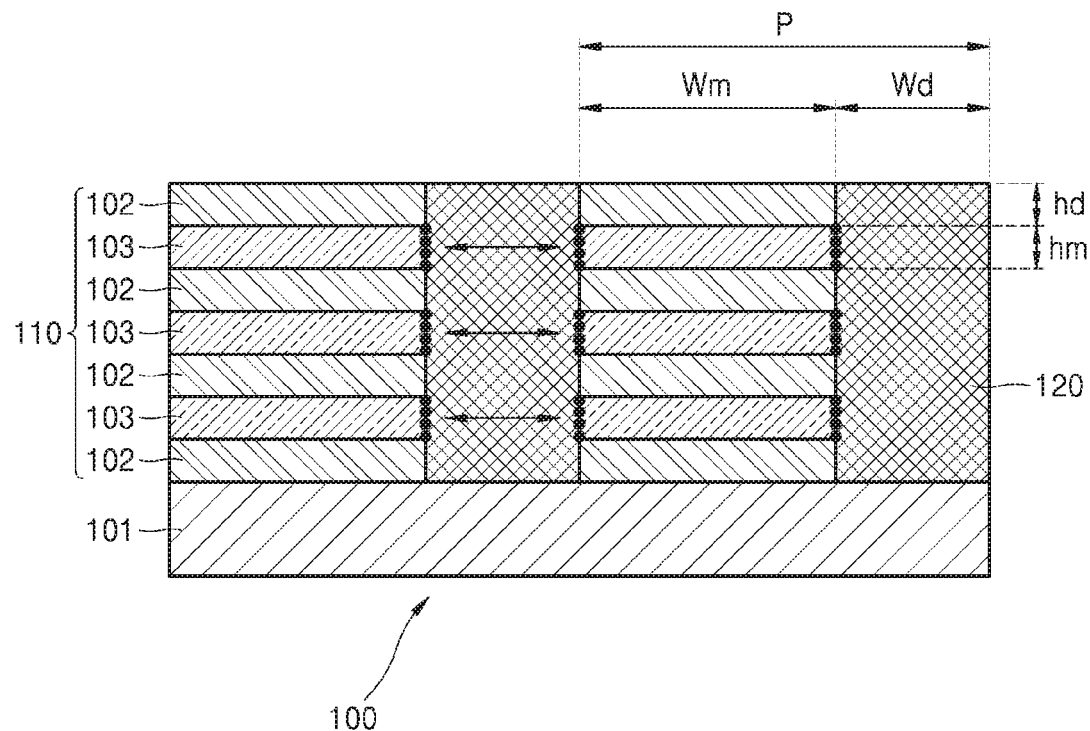
FIG. 1 is a cross-sectional view of a structure of a phase shifting device according to an example embodiment.

Hereinafter, a phase shifting device having a metal-dielectric composite structure will be described in detail with reference to the accompanying drawings. Like reference numerals refer to like elements throughout, and in the drawings, sizes of elements may be exaggerated for clarity and convenience of explanation. The example embodiments described below are merely examples, and various modifications may be possible from the embodiments.

In a layer structure described below, an expression such as "above" or "on" may include not only the meaning of "immediately on/under/to the left/to the right in a contact manner", but also the meaning of "on/under/to the left/to the right in a non-contact manner". Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be further understood that the terms "comprises" and/or "comprising" used herein specify the presence of stated features or elements, but do not preclude the presence or addition of one or more other features or elements.

Figure 2:
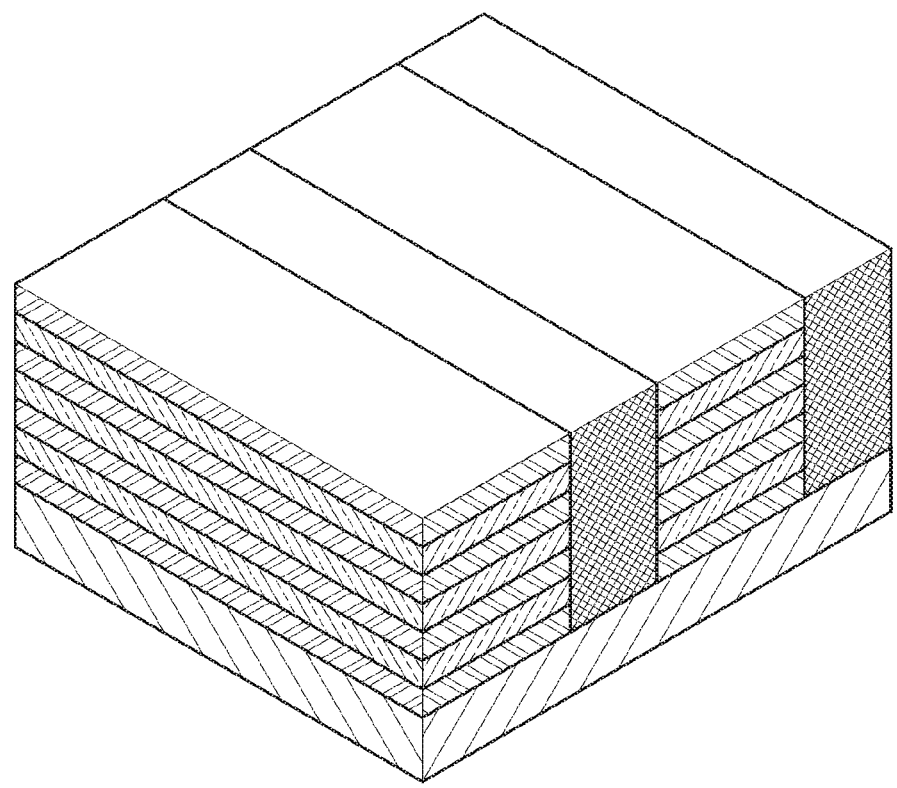
FIG. 2 is a perspective view of a structure of a phase shifting device shown in FIG. 1.

FIG. 1 is a cross-sectional view of a structure of a phase shifting device according to an example embodiment, and FIG. 2 is a perspective view of a structure of the phase shifting device shown in FIG. 1. Referring to FIGS. 1 and 2, a phase shifting device 100 according to an example embodiment may include a stacked structure 110 in which a first dielectric layer 102 and a metal layer 103 are alternately stacked in a vertical direction, and a second dielectric layer 120 disposed adjacent to a side surface of the stacked structure 110 in a horizontal direction. The phase shifting device 100 may further include a transparent substrate 101, and the stacked structure 110 and the second dielectric layer 120 may both be disposed on an upper surface of the transparent substrate 101. For example, the transparent substrate 101 may include glass, quartz, fused silica, or amorphous sapphire ($Al_2O_3$).

The stacked structure 110 may include a plurality of first dielectric layers 102 and a plurality of metal layers 103 alternately stacked on the transparent substrate 101 in a vertical direction. For example, the stacked structure 110 may include at least two metal layers 103. The metal layer 103 may have a relatively small thickness such that light may be transmitted. For example, a thickness hm of the metal layer 103 may range from about 5 nm to about 20 nm. In addition, the plurality of metal layers 103 may be separated at regular intervals from each other by the first dielectric layer 102. The distance between two adjacent metal layers 103 may be adjusted by the thickness hd of the first dielectric layer 102 between the adjacent two metal layers 103. For example, the first dielectric layer 102 may have a thickness of about 2.5 nm to about 15 nm.

Furthermore, the plurality of first dielectric layers 102 may be directly disposed on a lower surface and an upper surface of each of the metal layers 103. For example, the first dielectric layer 102 may be disposed first on the transparent substrate 101, and the metal layer 103 may be disposed on the first dielectric layer 102. Lastly, the first dielectric layer 102 may be disposed on the metal layer 103 after the first dielectric layer 102 and the metal layer 103 are alternately disposed.

The phase shifting device 100 may include a plurality of stacked structures 110 and the plurality of second dielectric layers 120 that are alternately disposed. For example, the plurality of stacked structures 110 and the plurality of second dielectric layers 120 may be disposed in a horizontal direction on the surface of the transparent substrate 101. Therefore, the direction in which the plurality of stacked structures 110 and the plurality of second dielectric layers 120 are disposed may be perpendicular to the direction in which the plurality of first dielectric layers 102 and the plurality of metal layers 103 are stacked. Although only two stacked structures 110 and two second dielectric layers 120 are shown in FIG. 1, according to example embodiments a very large number of stacked structures 110 and second dielectric layers 120 may be disposed one-dimensionally or two-dimensionally. A gap between two adjacent stacked structures 110 may be adjusted by a width Wd of the second dielectric layer 120.

One stacked structure 110 and one second dielectric layer 120 adjacent to a side surface of the stacked structure 110 constitute one unit element of the phase shifting device 100. A sum of a pitch P or period of the unit element, that is, a width Wm of the stacked structure 110 and a width Wd of the second dielectric layer 120, may be less than a wavelength of incident light to obtain a special optical effect. In more detail, the pitch P of the unit element may be less than a wavelength band in which the shifting device 100 mainly operates. For example, the pitch P of the unit element may be less than ½ or ⅓ of the wavelength of the incident light.

According to the example embodiment, localized surface plasmon resonance may occur as electrical resonance at an upper surface and a lower surface of each metal layer 103. The surface plasmon resonance is a phenomenon in which, when light is incident on the surface of a metal, a very high electric field locally occurs on the surface of the metal due to the collective oscillation of free electrons in the metal. The surface plasmon resonance generally occurs at an interface between a metal and a dielectric. For surface plasmon resonance to occur, the metal layer 103 may use a metal material which more easily causes surface plasmon resonance and has less light loss at a relatively small thickness. For example, the metal layer 103 may include at least one of aluminum (Al), silver (Ag), gold (Au), and copper (Cu).

Light transmitted through the phase shifting device 100 repeatedly passes through the plurality of metal layers 103 to cause surface plasmon resonance. In this process, the phase shifting device 100 may have a relatively high refractive index with respect to light corresponding to a resonance wavelength band of the surface plasmon resonance. The resonance wavelength band may vary depending on various factors such as the thickness hm of each metal layer 103, a gap between the two adjacent metal layers 103 or a thickness hd of each first dielectric layer 102, the width of each metal layer 103, the width Wm of the first dielectric layer 110, the number of metal layers 103, a material of the metal layer 103, a material of the first dielectric layer 102, and the like.

When a sum of the thickness hd of each first dielectric layer 102 and the thickness hm of each metal layer 103 is smaller light may cause more surface plasmon resonance in a short path while passing through the phase shifting device 100. For example, a sum of the thickness hd of one first dielectric layer 102 and the thickness hm of one metal layer 103 may be 30 nm or less.

Furthermore, the first dielectric layer 102 may more efficiently cause surface plasmon resonance on a surface of the metal layer 103 and may use a dielectric material which is transmissive in a wavelength band of incident light. As described above, the surface plasmon resonance occurs at the interface between a metal layer and a dielectric layer. In general, the smaller the dielectric constant of the dielectric layer in contact with the metal layer, the more occurrence of the surface plasmon resonance. For example, the first dielectric layer 102 may include a low-k dielectric material having a dielectric constant of less than 20. For example, the first dielectric layer 102 may include at least one of $SiO_2$, $Al_2O_3$, $Si_3N_4$, $Na_2SO_4$, $Sr_3(PO_4)_2$, $YAlO_3$, $MgSiO_3$, YOCl, $CaB_4O_7$, $Al_2MgO_4$, $Ba_2SiO_4$, $B_2O_3$, $Mg_4O_3(OH)_2$, $Ba_3P_4O_{13}$, $Li_3OBr$, $Mg(OH)_2$, $Y_2(Si_2O_7)$, $AlLiO_2$, YOF, $Ba_3(PO_4)_2$, $SrB_4O_7$, $BaSO_4$, and poly(methyl methacrylate).

Meanwhile, when light passes through the metal layer 103, electron accumulation occurs in which free electrons excited by light in the metal layer 103 are accumulated on both edges of the metal layer 103 in contact with the second dielectric layer 120. Then, as indicated by an arrow in FIG. 1, a magnetic field may be formed between electrons accumulated at an edge of the metal layer 103 in a first unit element and electrons accumulated at an edge of the metal layer 103 in a second unit element adjacent to the first unit element, and magnetic resonance may occur. For example, magnetic resonance occurs between the right edge of one metal layer 103 of the first unit element and the left edge of the metal layer 103 in the second unit element adjacent to the metal layer 103 of the first unit element at the same height.

Light passing through the phase shifting device 100 may undergo a plurality of magnetic resonance repeatedly so that the phase shifting device 100 has a relatively high refractive index with respect to light corresponding to a resonance wavelength band of the magnetic resonance. When the second dielectric layer 120 has a higher dielectric constant, free electrons may more easily accumulate at an interface between the metal layer 103 and the second dielectric layer 120 to increase a magnetic resonance effect. For example, the second dielectric layer 120 may include a high-k dielectric material having a dielectric constant greater than 30. For example, the second dielectric layer 120 may include at least one of $TiO_2$, $HfO_2$, $ZrO_2$, $ZnO$, $SrTiO_3$, $GaN$, $GaP$, $BeO$, $NbOCl_3$, $NaNbO_3$, $NaTaO_3$, $AgTaO_3$, $Li_4CO_4$, $CdTiO_3$, $KTaO_3$, $Y_2Ti_2O_7$, $Cd_2Ta_2O_7$, $PbHfO_3$, $AlO(OH)$, $SrHfO_3$, $Ag_2Ta_4O_{11}$, $BaZrO_3$, $PbZrO_3$, $NaIO_3$, $BiTaO_4$, $HfTe_3O_8$, $K_2W_2O_7$, and $Sr_2Ta_2O_7$.

Furthermore, when the width Wd of the second dielectric layer 120 is excessively large, a gap between the electrons accumulated in one edge of the metal layer 103 in one unit element and the electrons accumulated in one edge of the metal layer 103 in the other unit element adjacent to the one unit element may widen further, and a magnetic resonance effect may be degraded. Therefore, in order to obtain a sufficient magnetic resonance effect, the maximum width of the second dielectric layer 120 may be equal to or less than a width of the stacked structure 110. In other words, a width of the stacked structure 110 or a width of the metal layer 103 may be equal to or greater than the width of the second dielectric layer 120. For example, the width Wm of the stacked structure 110 may be from about 30 nm to about 110 nm. The width Wd of the second dielectric layer 120 may be, for example, about 20 nm to about 50 nm. Further, as described above, the width or the pitch P of one unit element of the phase shifting device 100 is less than the wavelength band in which the phase shifting device 100 mainly operates. For example, a sum of the width Wm of the stacked structure 110 and the width Wd of the second dielectric layer 120 may be about 50 nm to about 200 nm.

As described above, the phase shifting device 100 according to the example embodiment has a first resonance wavelength band by surface plasmon resonance which is electrical resonance at an interface between the metal layer 103 and the first dielectric layer 102, and a second resonance wavelength band by magnetic resonance between the adjacent metal layers 103 in the two adjacent stacked structures 110. The phase shifting device 100 has a relatively high refractive index with respect to light in the first resonance wavelength band and light in the second resonance wavelength band. According to an example embodiment, the first resonance wavelength band is less than the second resonance wavelength band. Then, in a wavelength band between the first resonance wavelength band and the second resonance wavelength band, the phase shifting device 100 may maintain a relatively high refractive index constant. For example, in the wavelength band between the first resonance wavelength band and the second resonance wavelength band, the phase shifting device 100 may maintain a refractive index of about 4 or more at a constant level.

Figure 3:
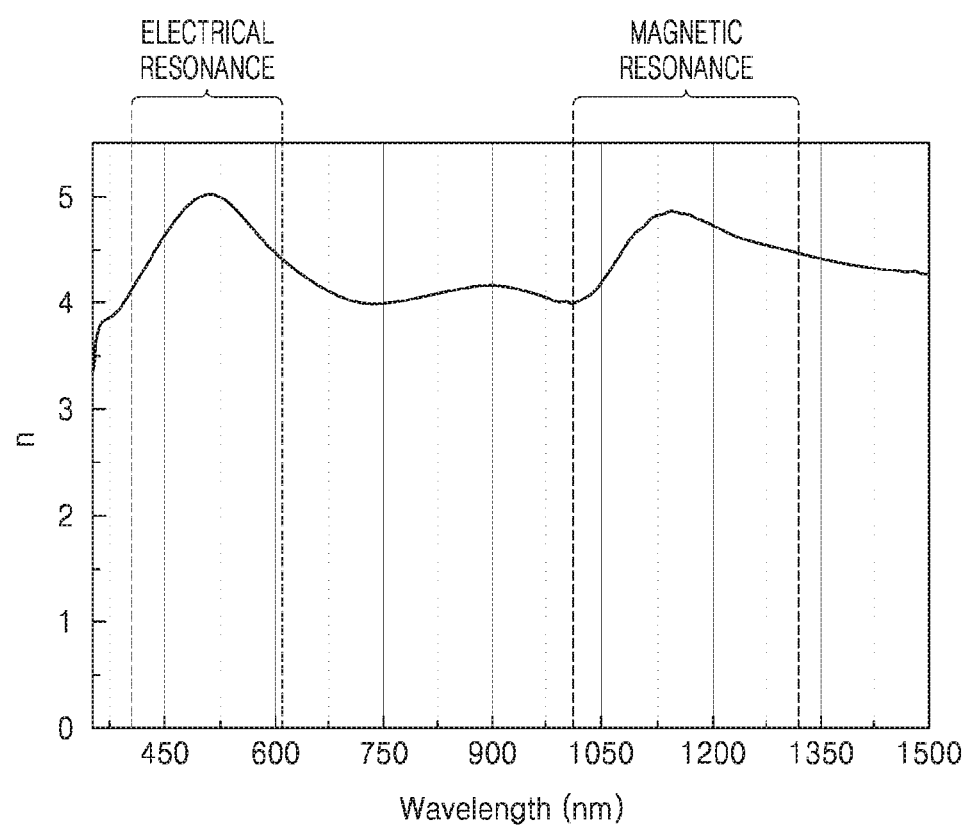
FIG. 3 is a graph of a refractive index characteristic according to a wavelength of the phase shifting device shown in FIG. 1.

For example, FIG. 3 is a graph of a refractive index characteristic according to the wavelength of the phase shifting device 100 shown in FIG. 1. Referring to the graph of FIG. 3, electrical resonance occurs in a wavelength band of about 400 nm to about 600 nm, that is, the first resonance wavelength band, and a first peak of a refractive index of about 5 at a wavelength of about 500 nm is formed. The magnetic resonance occurs in a wavelength band of about 1,000 nm to about 1,300 nm, that is, the second resonance wavelength band, and a second peak of a refractive index of about 5 at a wavelength of about 1,130 nm is formed. In a red visible light and near infrared region between about 600 nm and about 1,000 nm between the first resonance wavelength band and the second resonance wavelength band, a refractive index of about 4 may be maintained substantially constant.

Therefore, the phase shifting device 100 according to the example embodiment may have a relatively high refractive index and a constant refractive index over a relatively wide wavelength band. In particular, the phase shifting device 100 may achieve a relatively high refractive index and a constant refractive index in a visible light or near infrared region. Therefore, by using the phase shifting device 100 according to the example embodiment, an optical device which may operate in a visible light band or a near infrared band and has relatively little chromatic aberration may be realized.

As described above, a wavelength band in which a relatively high refractive index of about 4 or more may be maintained is the wavelength band between the first resonance wavelength band and the second resonance wavelength band. The first resonance wavelength band may be determined according to various factors such as the thickness hm of each metal layer 103, the gap between adjacent two metal layers 103 or the thickness hd of each first dielectric layer 102, the width of each metal layer 103, the width Wm of the first dielectric layer 110, the number of metal layers 103, the material of the metal layer 103, the material of the first dielectric layer 102, and the like. Furthermore, the second resonance wavelength band may be determined according to various factors such as the thickness hm of each metal layer 103, the width of each stacked structure 110 or the width Wm of each metal layer 103, the width Wd of the second dielectric layer 120, the pitch P of one unit element, the number of metal layers 103, the material of the metal layer 103, the material of the second dielectric layer 120, and the like. Thus, by adjusting the above factors, the optical characteristics of the phase shifting device 100 such as a wavelength band and a value of a refractive index at which a high refractive index may be maintained may be determined.

Figure 4:
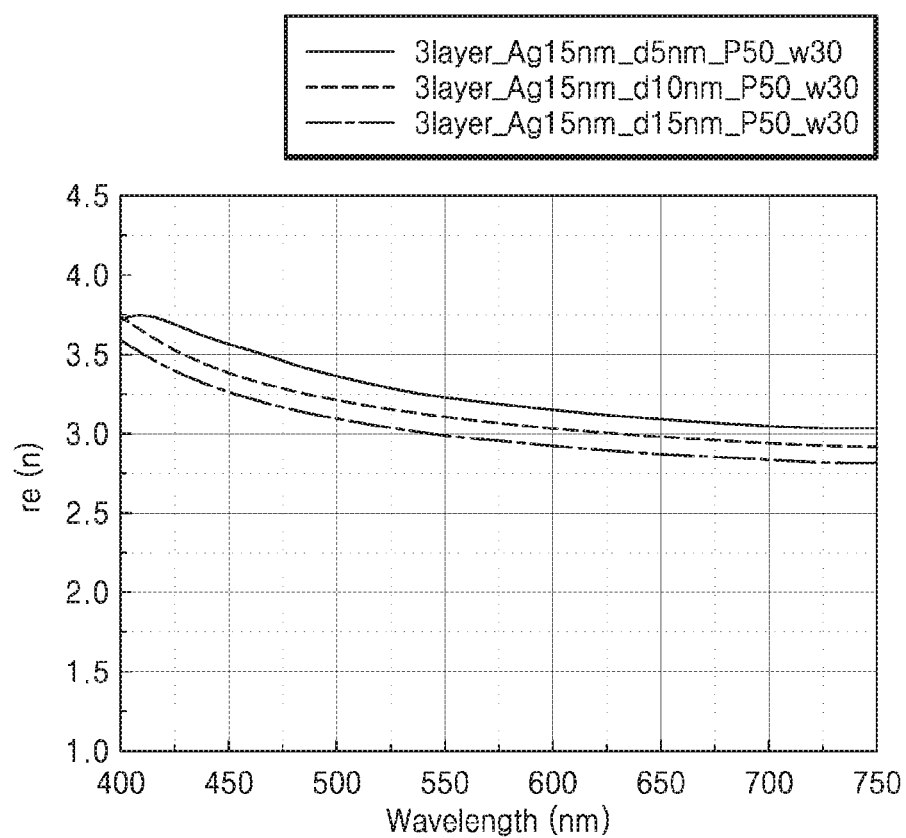
FIG. 4 is a graph illustrating a change in a refractive index characteristic according to a wavelength of the phase shifting device shown in FIG. 1 when changing the thickness of a first dielectric layer.

FIG. 4 is a graph illustrating a change in a refractive index characteristic according to a wavelength of the phase shifting device 100 shown in FIG. 1 when changing the thickness hd of the first dielectric layer 102. In the example of FIG. 4, three metal layers 103 are used, Ag is used as a material of the metal layer 103, and a thickness of the metal layer 103 is fixed to 15 nm. Furthermore, the thickness hd of the first dielectric layer 102 is changed between 5 nm, 10 nm, and 15 nm in a state where the width Wm of the metal layer 103 is fixed at 30 nm and the pitch P of one unit element is fixed at 50 nm. In addition, $SiO_2$ is used as the material of the first dielectric layer 102, and $HfO_2$ is used as a material of the second dielectric layer 120. Referring to the graph of FIG. 4, it can be seen that a refractive index of the phase shifting device 100 increases as a thickness of the first dielectric layer 102 decreases in a wavelength band of 400 nm to 750 nm.

Figure 5:
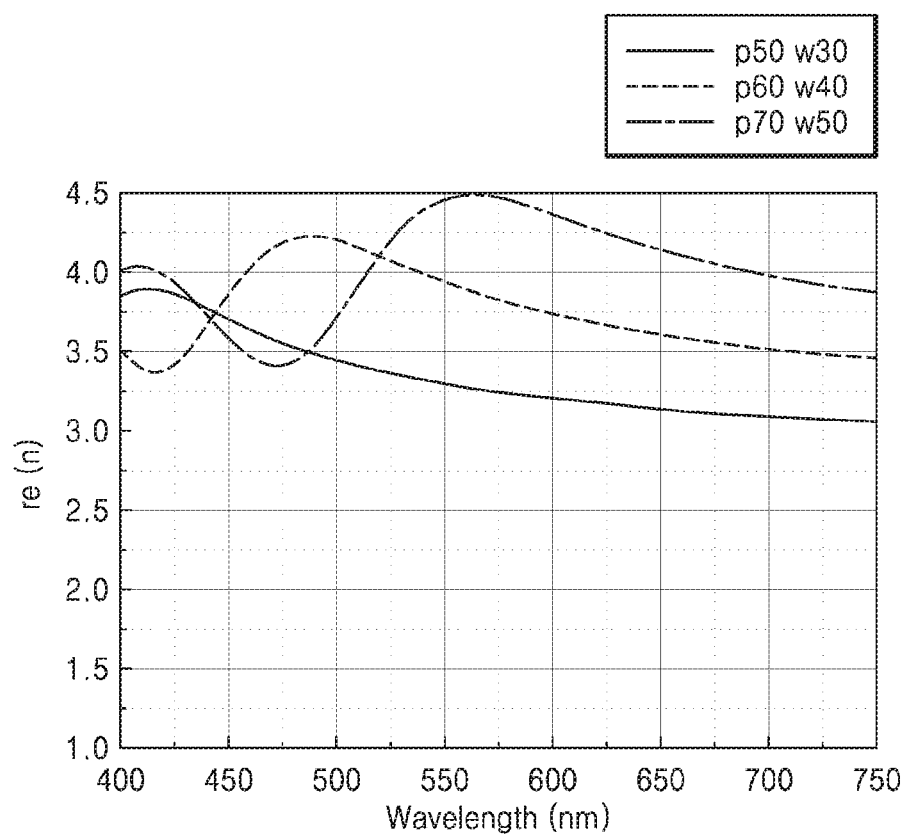
FIG. 5 is a graph illustrating a change in a refractive index characteristic according to a wavelength of the phase shifting device shown in FIG. 1 when changing the width of a metal layer and the pitch of one unit element.

FIG. 5 is a graph illustrating a change in a refractive index characteristic according to a wavelength of the phase shifting device 100 shown in FIG. 1 when changing the width Wm of the metal layer 103 and the pitch P of one unit element. In the example of FIG. 5, three metal layers 103 are used, Ag is used as a material of the metal layer 103, $SiO_2$ is used as a material of the first dielectric layer 102, and $HfO_2$ is used as a material of the second dielectric layer 120. Furthermore, the width Wm of the metal layer 103 is changed between 30 nm, 40 nm, and 50 nm and the pitch P of one unit element is changed between 50 nm, 60 nm, and 70 nm in a state where the thickness hd of the first dielectric layer 102 is fixed at 5 nm and the thickness hm of the metal layer 103 is fixed at 10 nm. Referring to the graph of FIG. 5, it can be seen that the refractive index of the phase shift device 100 generally increases as the width Wm of the metal layer 103 increases in a wavelength band of 400 nm to 750 nm.

In the example embodiment shown in FIG. 1, each of the stacked structures 110 includes three metal layers 103 and four first dielectric layers 102, and a lowermost layer and an uppermost layer of the stacked structure 110 are the first dielectric layer 102. However, this is merely an example and the structure of the stacked structure 110 is not limited thereto. The number of first dielectric layers 102, the number of metal layers 103, and a stacking order of the first dielectric layer 102 and the metal layer 103 may vary depending on optical characteristics required for the phase shifting device 100.

Figure 6:
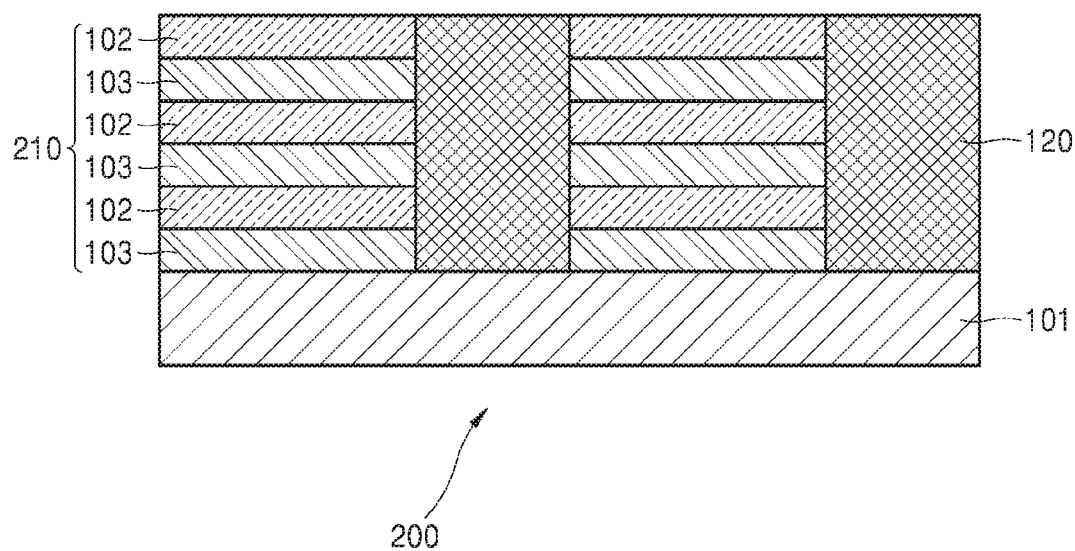
FIG. 6 is a cross-sectional view of a structure of a phase shifting device according to an example embodiment.

For example, FIG. 6 is a cross-sectional view of a structure of a phase shifting device according to an example embodiment. Referring to FIG. 6, a phase shifting device 200 may include a stacked structure 210 in which the metal layer 103 and the first dielectric layer 102 are alternately stacked in a vertical direction, and the second dielectric layer 120 disposed adjacent to a side surface of the stacked structure 210 in a horizontal direction. The stacked structure 210 may include the metal layer 103 and the first dielectric layer 102 alternately stacked on an upper surface of the transparent substrate 101 in a vertical direction. For example, the metal layer 103 may be first disposed on the upper surface of the transparent substrate 101, and the first dielectric layer 102 may be disposed thereon. The first dielectric layer 102 may be disposed at the top layer of the stacked structure 210.

Figure 7:
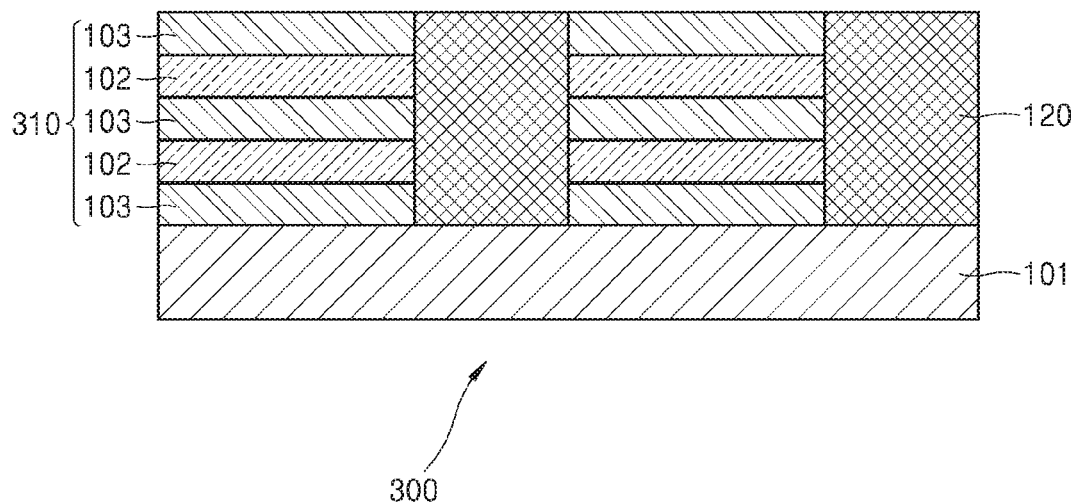
FIG. 7 is a cross-sectional view of a structure of a phase shifting device according to an example embodiment.

Also, FIG. 7 is a cross-sectional view of a structure of a phase shifting device according to an example embodiment. Referring to FIG. 7, a phase shifting device 300 may include a stacked structure 310 in which the metal layer 103 and the first dielectric layer 102 are alternately stacked in a vertical direction, and the second dielectric layer 120 disposed adjacent to a side surface of the stacked structure 310 in a horizontal direction. The structure of the stacked structure 310 shown in FIG. 7 may be substantially similar to the structure of the stacked structure 210 shown in FIG. 6. However, according to the example embodiment shown in FIG. 7, the metal layer 103 is disposed at the top of the stacked structure 310.

Figure 8:
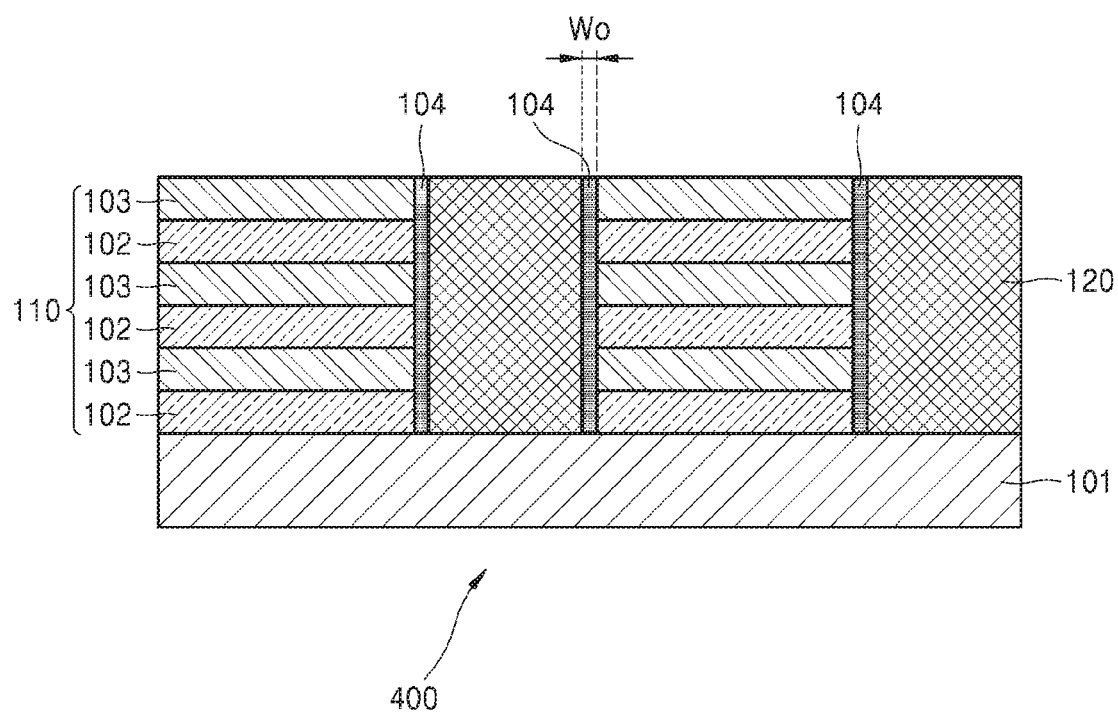
FIG. 8 is a cross-sectional view of a structure of a phase shifting device according to an example embodiment.

FIG. 8 is a cross-sectional view of a structure of a phase shifting device according to an example embodiment. Referring to FIG. 8, a phase shifting device 400 may include the stacked structure 110 in which the metal layer 103 and the first dielectric layer 102 are alternately stacked in a vertical direction, and the second dielectric layer 120 disposed adjacent to a side surface of the stacked structure 110 in a horizontal direction, and an oxide layer 104 is disposed between the side surfaces of the stacked structure 110 and the second dielectric layer 120 in a horizontal direction. The stacked structure 110 shown in FIG. 8 may be the same as the stacked structure 110 shown in FIG. 1. However, in FIG. 8, the stacked structure 110 may be replaced with the stacked structure 210 shown in FIG. 6 or the stacked structure 310 shown in FIG. 7.

The oxide layer 104 may have a width Wo of about 3 nm or less and extend in a vertical direction along an interface between the stacked structure 110 and the second dielectric layer 120. FIG. 8 shows that the oxide layer 104 is uniformly disposed along the interface between the stacked structure 110 and the second dielectric layer 120. However, example embodiments are not limited thereto, and the oxide layer 104 may be disposed only at the interface between the metal layer 103 and the second dielectric layer 120, and may be disposed only partially disposed or not disposed at the interface between the first dielectric layer 102 and the second dielectric layer 120. The oxide layer 104 may include, for example, an oxide of a metal material of the metal layer 103.

Figure 9:
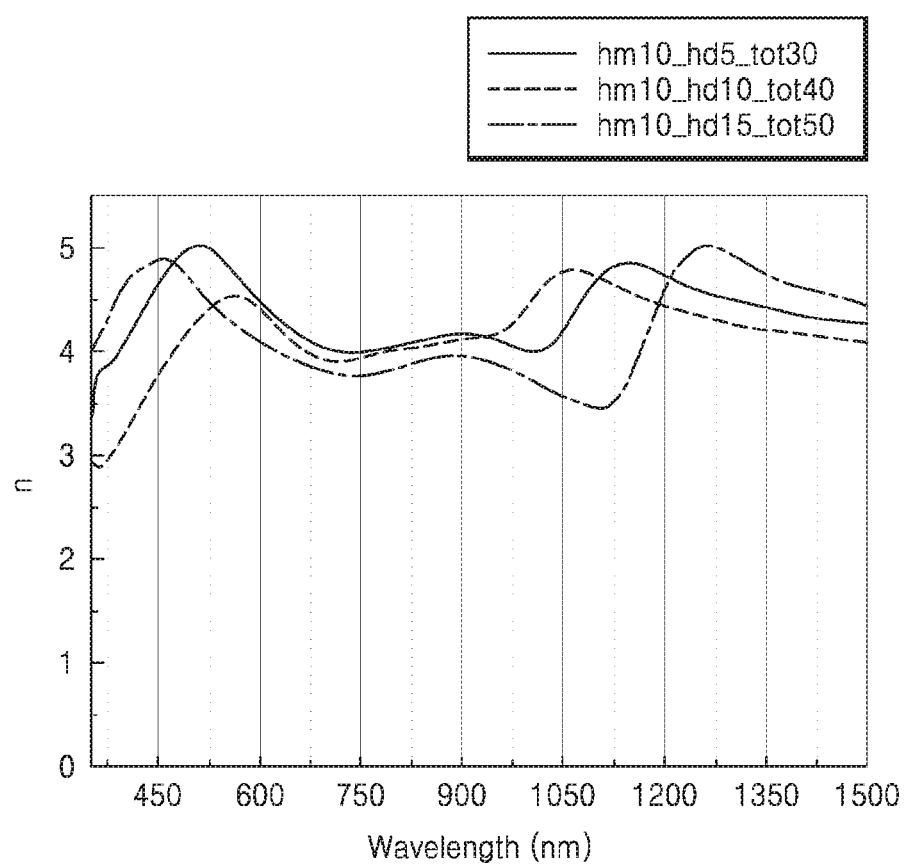
FIG. 9 is a graph illustrating a change in a refractive index characteristic according to a wavelength of the phase shifting device shown in FIG. 8 when changing the thickness of a first dielectric layer.

FIG. 9 is a graph illustrating a change in a refractive index characteristic according to a wavelength of the phase shifting device 400 shown in FIG. 8 when changing the thickness hd of the first dielectric layer 102. In the example of FIG. 9, two metal layers 103 are used, Al is used as a material of the metal layer 103, and a thickness of the metal layer 103 is fixed to 10 nm. Furthermore, the thickness hd of the first dielectric layer 102 is changed between 5 nm, 10 nm, and 15 nm in a state where the width Wm of the metal layer 103 is fixed at 110 nm and the pitch P of one unit element is fixed at 150 nm. In addition, $Al_2MgO_4$ is used as a material of the first dielectric layer 102, and $HfO_2$ is used as a material of the second dielectric layer 120. A thickness of the oxide layer 104 formed of aluminum oxide is about 2.5 nm. Referring to the graph of FIG. 9, it can be seen that the refractive index of the phase shifting device 100 generally increases as the thickness of the first dielectric layer 102 decreases in a wavelength band of 600 nm to 900 nm. In particular, it can be seen that the refractive index of 4 or more is kept constant in the wavelength band of 650 nm to 1,000 nm when the thickness hd of the first dielectric layer 102 is 5 nm and 10 nm. Further, when the thickness hd of the first dielectric layer 102 is fixed, a difference of the refractive index within a wavelength band of 650 nm to 1,000 nm may be about 0.3 or less.

According to example embodiments, shapes of the stacked structure 110 and the second dielectric layer 120 in the phase shifting devices 100, 200, 300 and 400 described above may vary depending on optical characteristics required for the phase shifting devices 100, 200, 300, and 400. For example, FIGS. 10 and 11 are plan views of the shape of an upper surface of a phase shifting device having polarization dependence according to example embodiments.

Figure 10:
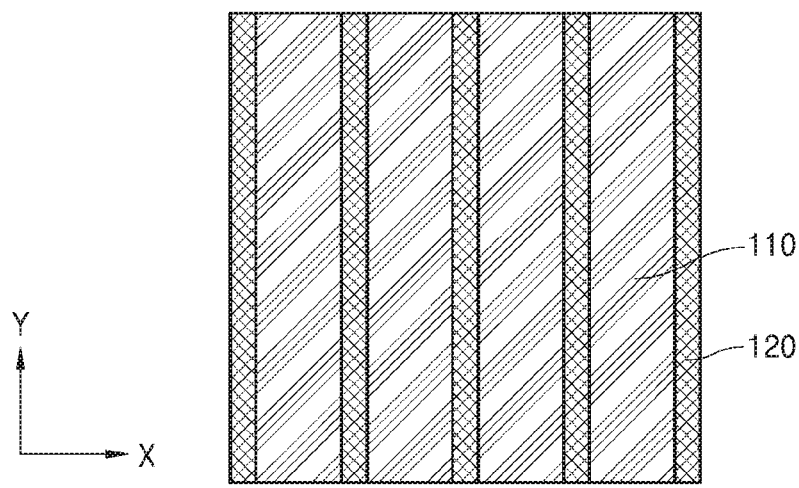
FIGS. 10 and 11 are plan views of the shape of an upper surface of a phase shifting device having polarization dependence according to example embodiments.

Referring to FIG. 10, the stacked structure 110 and the second dielectric layer 120 may be longer in a y-axis direction compared to the x-axis direction. In this example, it can be seen that the stacked structure 110 having a rod shape extending in the y-axis direction and the second dielectric layer 120 having a rod shape extending in the y-axis direction are alternately disposed in an x-axis direction. Then, the phase shifting device may transmit light of a linear polarization component in the y-axis direction.

Figure 11:
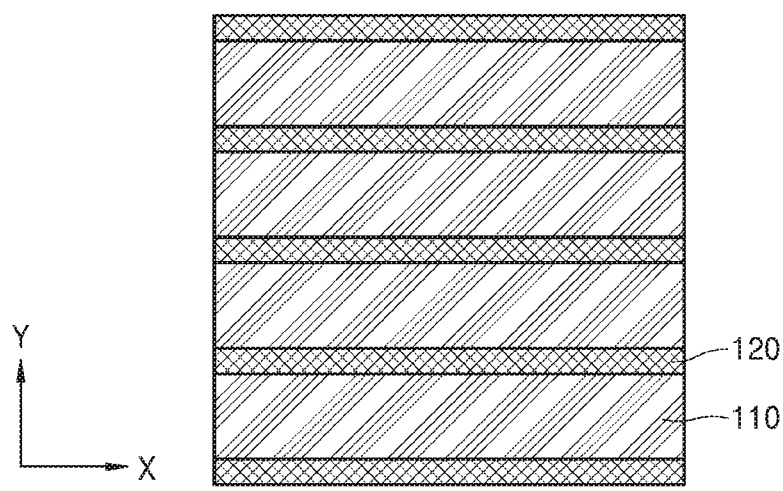

Referring to FIG. 11, the stacked structure 110 and the second dielectric layer 120 may be longer in the x-axis direction compared to the y-axis direction. In this example, it can be seen that the stacked structure 110 having a rod shape extending in the x-axis direction and the second dielectric layer 120 having a rod shape extending in the x-axis direction are alternately disposed in the y-axis direction. Then, the phase shifting device may transmit light of a linear polarization component in the x-axis direction.

Figure 12A:
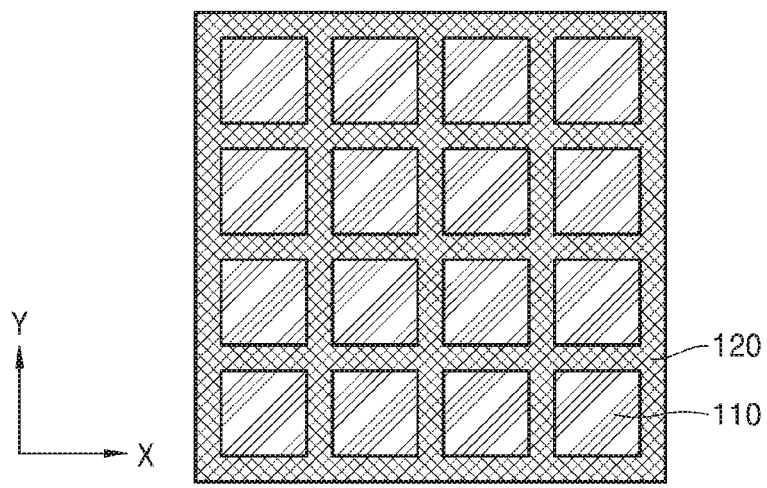
FIG. 12A is a plan view of the shape of an upper surface of a phase shifting device having non-polarization characteristics according to an example embodiment.
Figure 12B:
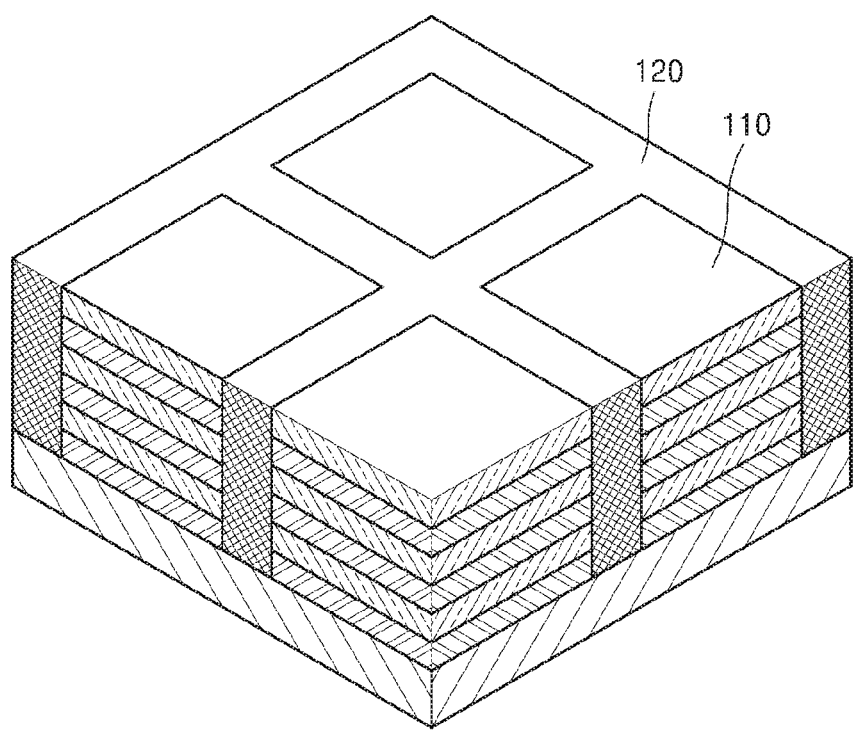
FIG. 12B is a perspective view of the structure of a phase shifting device having non-polarization characteristics according to an example embodiment.

Furthermore, FIG. 12A is a plan view of the shape of an upper surface of a phase shifting device having non-polarization characteristics and FIG. 12B is a perspective view of the structure of a phase shifting device having non-polarization characteristics according to example embodiments. Referring to FIGS. 12A and 12B, the phase shifting device includes the plurality of stacked structures 110 that are two-dimensionally disposed in x-axis and y-axis directions, and the second dielectric layer 120 may have a lattice shape surrounding all sides of the plurality of stacked structures 110. In this example, the phase shifting device may transmit light of all polarization components.

Figure 13:
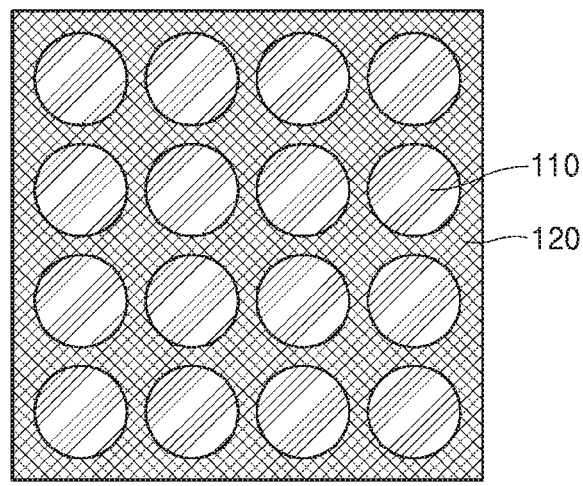
FIGS. 13 and 14 are plan views of various forms of a stacked structure according to example embodiments.
Figure 14:
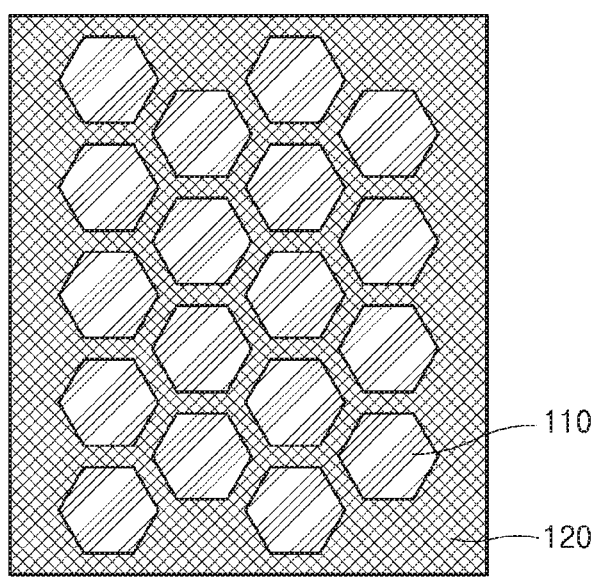

FIGS. 12A and 12B show that each of the stacked structures 110 has a square shape, but the shape of the stacked structure 110 may vary. For example, FIGS. 13 and 14 are plan views showing various forms of the stacked structure 110. As shown in FIG. 13, the stacked structure 110 may have a two-dimensionally disposed circular shape. Further, as shown in FIG. 14, the stacked structure 110 may have a two-dimensionally disposed hexagonal shape. In addition, the stacked structure 110 may have an elliptical shape, a triangular shape, a rectangular shape, a parallelogram shape, a trapezoidal shape, a rhombus shape, and a polygonal shape of at least a pentagon.

Although FIGS. 10 to 14 have been described with respect to the shape of the stacked structure 110 shown in FIG. 1, the same description with respect to FIGS. 10 to 14 is also applicable to the stacked structures 210 and 310 shown in FIGS. 6 and 7.

FIGS. 15A to 15E are cross-sectional views illustrating a method of manufacturing the phase shifting device 100 according to an example embodiment.

Figure 15A:
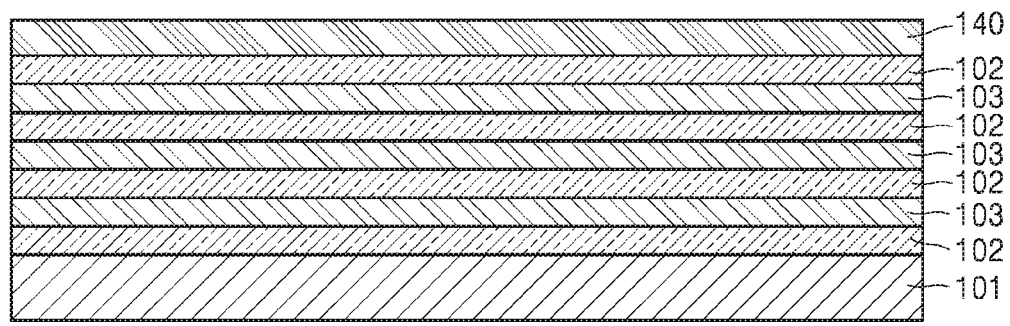
FIGS. 15A to 15E are cross-sectional views illustrating a method of manufacturing a phase shifting device according to an example embodiment.

First, referring to FIG. 15A, the first dielectric layer 102 and the metal layer 103 are alternately stacked on an upper surface of the transparent substrate 101. In FIG. 15A, the first dielectric layer 102 is first stacked, the metal layer 103 is stacked on the first dielectric layer 102, and the first dielectric layer 102 is located at the top. However, as shown in FIGS. 6 and 7, the order of stacking the first dielectric layer 102 and the metal layer 103, and the number of first dielectric layers 102 and the metal layers 103 may vary. Thereafter, a mask layer 140 is stacked on the first dielectric layer 102 at the top to cover the entire surface of the first dielectric layer 102.

Figure 15B:
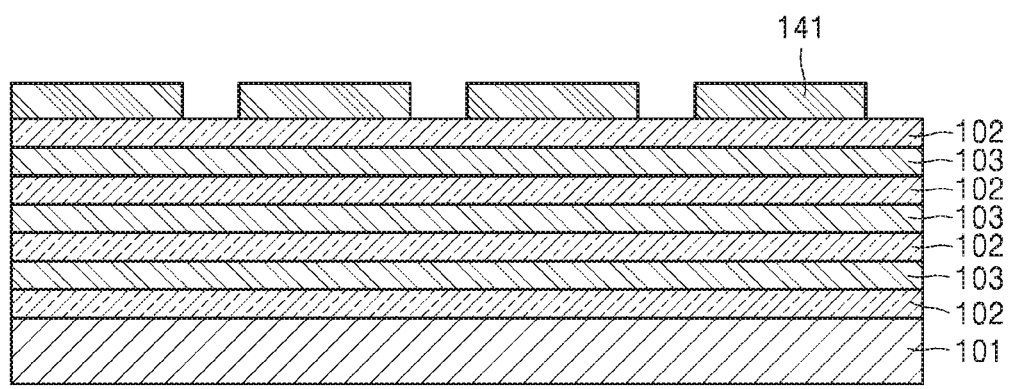

Next, referring to FIG. 15B, for example, the mask layer 140 is patterned through a photolithography process to form a patterned mask 141. The shape of the patterned mask 141 may be, for example, the same as a pattern shape of the stacked structure 110 shown in FIGS. 10 to 14. A portion of the first dielectric layer 102 exposed to the outside between the patterned masks 141 may be the same as a pattern shape of the second dielectric layer 120 shown in FIGS. 10 to 14.

Figure 15C:
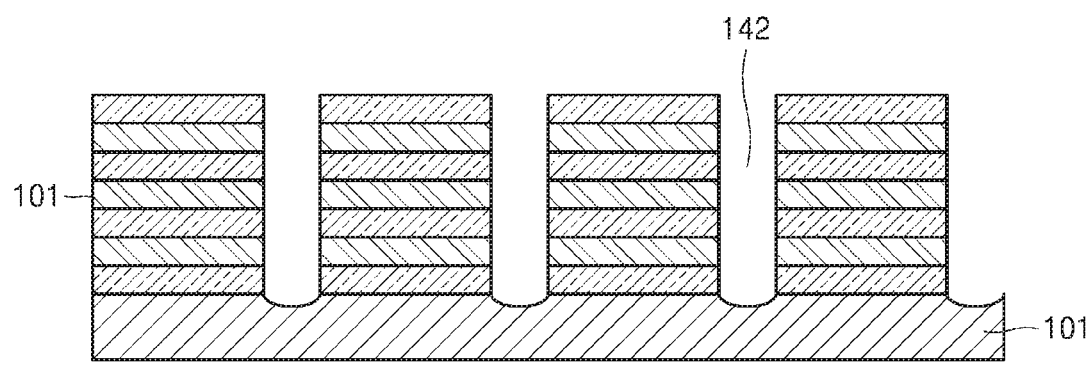

Thereafter, referring to FIG. 15C, a plurality of portions of the first dielectric layer 102 exposed to the outside between patterned masks 141 and the plurality of metal layers 103 are removed by etching in a vertical direction so that the transparent substrate 101 is exposed to the outside. When the transparent substrate 101 is exposed to the outside, the etching process is stopped and an etchant is washed. Then, the patterned masks 141 are removed. Accordingly, the plurality of stacked structures 110 are formed, and a plurality of trenches 142 are formed between the plurality of stacked structures 110.

Figure 15D:
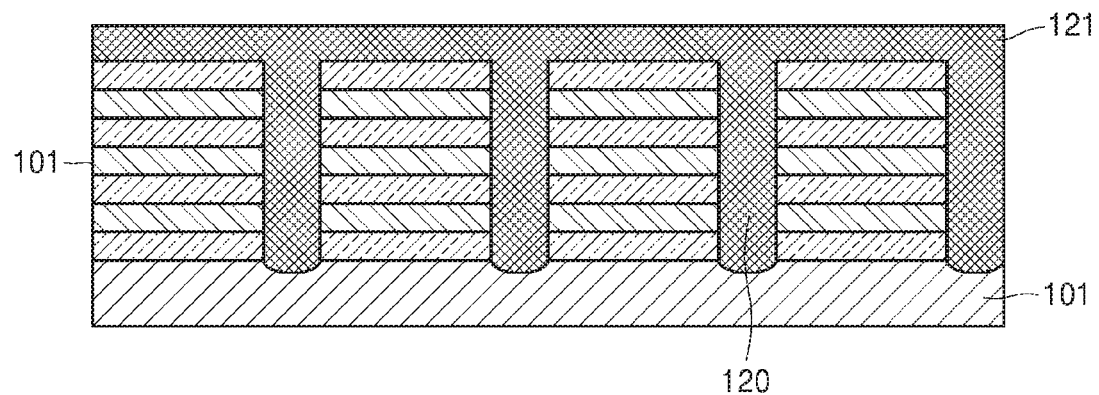

Referring to FIG. 15D, a second dielectric layer material 121 is filled in a trench 142. For example, the second dielectric layer material 121 may be filled in all of the plurality of trenches 142 and cover all of the upper surfaces of the plurality of stacked structures 110. Then, the second dielectric layer 120 may be formed between the plurality of stacked structures 110. The process may be completed without removing the second dielectric layer material 121 on the upper surface of the stacked structure 110. The phase shifting device 100 may then include the second dielectric layer 120 extending to the upper surface of the stacked structure 110.

Figure 15E:
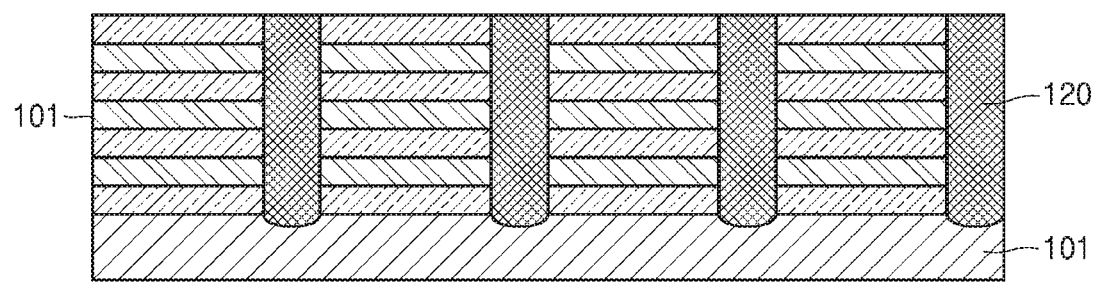

Finally, referring to FIG. 15E, the second dielectric layer material 121 on the upper surface of the stacked structure 110 may be removed using a planarization process such as chemical mechanical polishing (CMP). Then, the upper surface of the stacked structure 110 is exposed to the outside, and the upper surface of the stacked structure 110 and the upper surface of the second dielectric layer 120 may be coplanar.

As described above, the refractive indices of the phase shifting devices 100, 200, 300, and 400 according to the example embodiments may vary depending on various factors such as the thickness hm of the metal layer 103, the gap between adjacent two metal layers 103, the thickness hd of each first dielectric layer 102, the width of each metal layer 103 or the width Wm of each first dielectric layer 110, the number of metal layers 103, the material of the metal layer 103, the material of the first dielectric layer 102, the pitch P of one unit element, the material of the second dielectric layer 120, and the like. Therefore, by varying these factors depending on the regions of the phase shifting devices 100, 200, 300, and 400, the phase shifting devices 100, 200, 300, and 400 having certain refractive index distribution may be manufactured. The phase of light passing through the phase shifting devices 100, 200, 300, and 400 may locally change when the refractive indices are locally changed depending on the regions of the phase shifting devices 100, 200, 300, and 400. The phase shifting devices 100, 200, 300, and 400 may serve as an optical device that performs a certain optical function.

For example, by using the phase shifting devices 100, 200, 300, and 400, it is possible to collect incident light, scatter or reflect the incident light in a specific direction, change a traveling direction of the incident light, or transmit or reflect only light of a specific wavelength among the incident light. In particular, since the phase shifting devices 100, 200, 300, and 400 according to the example embodiments have a high refractive index in a visible light or near infrared wavelength band and a constant refractive index is maintained over a relatively wide bandwidth, an optical device which may operate in a visible light band or a near infrared band and has relatively little chromatic aberration when the phase shifting devices 100, 200, 300, and 400 are used may be realized. For example, a lens device, a beam shaping device, a beam deflector, a beam steering device, a hologram device, or the like having an achromatic characteristic that maintains uniform optical performance in a wide bandwidth may be implemented. Operating characteristics of such an optical device may be determined according to refractive index distribution of the phase shifting devices 100, 200, 300, and 400.

Figure 16:
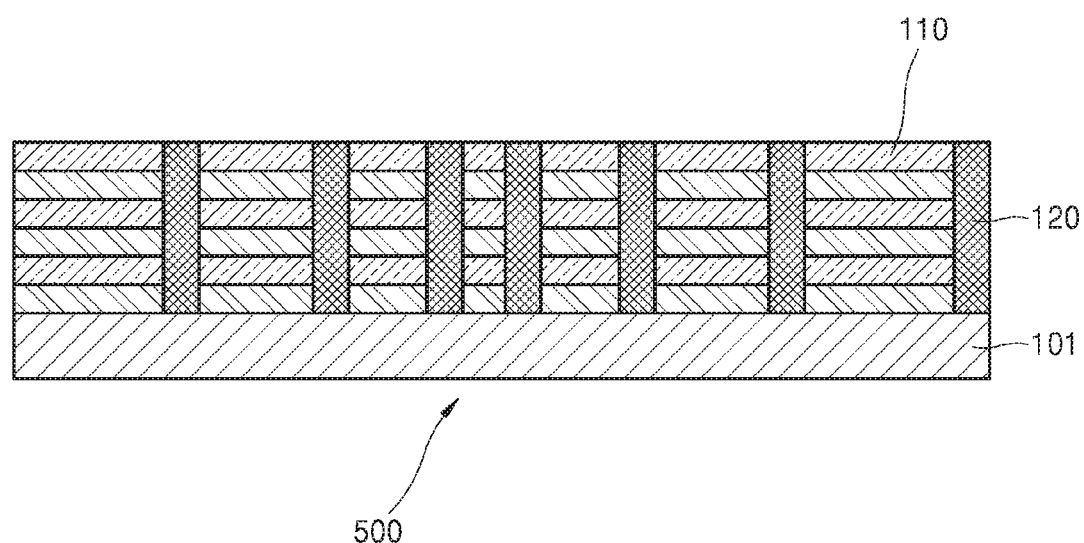
FIG. 16 is a sectional view of a schematic structure of a flat lens device as an optical device according to an example embodiment.

For example, FIG. 16 is a sectional view of a schematic structure of a flat lens device as an optical device according to an example embodiment. Referring to FIG. 16, a flat lens 500 includes the plurality of stacked structures 110 and the plurality of second dielectric layers 120 alternately disposed on the transparent substrate 101. As shown in FIG. 16, the width of the stacked structure 110 is the smallest at the center of the flat lens 500 and the widths of the plurality of stacked structures 110 may gradually increase symmetrically or asymmetrically toward an edge of the flat lens 500. For example, distribution of the widths of the stacked structures 110 may have distribution of a radially symmetric shape. Then, the flat lens 500 becomes a symmetrical planar lens. In addition, the widths of the plurality of stacked structures 110 may gradually increase asymmetrically. In this case, the flat lens 500 may be an asymmetric planar aspheric lens. A width of the second dielectric layer 120 may be the same in all regions of the flat lens 500. The flat lens 500 may have a relatively low chromatic aberration in a visible light or near infrared region.

FIG. 16 shows that the width of the stacked structure 110 is the smallest at the center of the flat lens 500 and the widths of the plurality of stacked structures 110 gradually increase symmetrically or asymmetrically toward an edge of the flat lens 500. However, for example, the width of the stacked structure 110 is the greatest at the center of the flat lens 500 and the widths of the plurality of stacked structures 110 may gradually decrease symmetrically or asymmetrically toward the edge of the flat lens 500. Furthermore, although FIG. 16 shows only the width of the stacked structure 110 is changed, other factors may be changed. For example, the flat lens 500 may include a plurality of stacked structures 110 that are different from one another in at least one of a width of a metal layer, a thickness of the metal layer, and a thickness of a first dielectric layer.

Figure 17:
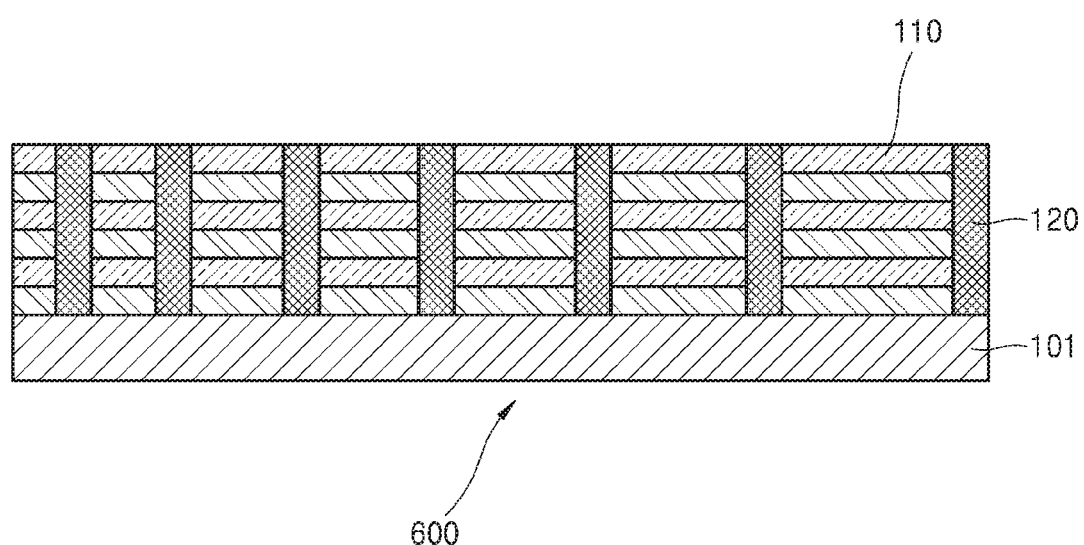
FIG. 17 is a cross-sectional view of a schematic structure of a beam deflector as an optical device according to an example embodiment.

FIG. 17 is a cross-sectional view of a schematic structure of a beam deflector according to an example embodiment. Referring to FIG. 17, a beam deflector 600 includes the plurality of stacked structures 110 and the plurality of second dielectric layers 120 alternately disposed on the substrate 101. As shown in FIG. 17, the widths of the plurality of stacked structures 110 may gradually increase or decrease in one direction. For example, the widths of the plurality of stacked structures 110 may gradually increase or decrease from left to right. Each stacked structure 110 and each second dielectric layer 120 may have a rod shape extending in one direction. A width of the second dielectric layer 120 may be the same in all regions of the beam deflector 600. The beam deflector 600 may uniformly deflect light of most wavelengths in a visible light or near infrared region at a constant angle.

Furthermore, although FIG. 17 shows only the width of the stacked structure 110 is changed, other factors may be changed. For example, the beam deflector 600 may include the plurality of stacked structures 110 that are different from one another in at least one of a thickness of the first dielectric layer 102, a thickness of the metal layer 103, a thickness of the first dielectric layer 102, and a total thickness of the stacked structures 110.

Although the phase shifting device having the above-described metal-dielectric composite structure has been described with reference to the example embodiments shown in the drawings, they are only examples. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A phase shifting device comprising:
    a stacked structure comprising a metal layer and a first dielectric layer, the metal layer and the first dielectric layer being alternately stacked in a first direction; and
    a second dielectric layer disposed on a side surface of the stacked structure in a second direction,
    wherein the first dielectric layer comprises a first material having a first dielectric constant and the second dielectric layer comprises a second material having a second dielectric constant, and
    wherein the second dielectric constant is greater than the first dielectric constant.

2. The phase shifting device of claim 1, wherein the stacked structure comprises at least two metal layers, and
    wherein a first dielectric layer is disposed between the two metal layers.

3. The phase shifting device of claim 1, further comprising:
    an oxide layer disposed between the side surface of the stacked structure and the second dielectric layer.

4. The phase shifting device of claim 1, wherein a sum of a width of the stacked structure and a width of the second dielectric layer is less than a wavelength of incident light.

5. The phase shifting device of claim 1, wherein a sum of a width of the stacked structure and a width of the second dielectric layer is less than ⅓ of a wavelength of incident light.

6. The phase shifting device of claim 1, wherein a width of the stacked structure is equal to or greater than a width of the second dielectric layer.

7. The phase shifting device of claim 1, further comprising:
    a plurality of stacked structures and a plurality of second dielectric layers disposed between the plurality of stacked structures.

8. The phase shifting device of claim 7, wherein each of the plurality of stacked structures and each of the plurality of second dielectric layers extend in a third direction, and the plurality of stacked structures and the plurality of second dielectric layers are alternately disposed in the second direction respectively perpendicular to the first direction and the third direction.

9. The phase shifting device of claim 7, wherein the plurality of stacked structures comprise a first stacked structure and a second stacked structure that are different from each other in at least one of a width of the metal layer, a thickness of the metal layer, and a thickness of the first dielectric layer.

10. The phase shifting device of claim 7, wherein widths of the plurality of stacked structures gradually increase or decrease in the second direction.

11. The phase shifting device of claim 7, wherein the phase shifting device has a first resonance wavelength band based on surface plasmon resonance at an interface between the metal layer and the first dielectric layer and a second resonance wavelength band based on magnetic resonance between metal layers of adjacent two stacked structures, and
    wherein the phase shifting device has a refractive index of 4 or more in a wavelength band between the first resonance wavelength band and the second resonance wavelength band.

12. The phase shifting device of claim 11, wherein a difference between a refractive index of the first resonance wavelength band and a refractive index of the second resonance wavelength band is 0.3 or less.

13. The phase shifting device of claim 1, wherein the phase shifting device comprises a plurality of stacked structures that are two-dimensionally disposed, and
    wherein the second dielectric layer has a lattice shape surrounding side surfaces of the plurality of stacked structures.

14. The phase shifting device of claim 13, wherein a horizontal cross-section of each of the stacked structures has one of a rectangular shape, hexagonal shape, circular shape, or polygonal shape.

15. The phase shifting device of claim 13, wherein the plurality of stacked structures comprise a first stacked structure and a second stacked structure that are different from each other in at least one of a width of the metal layer, a thickness of the metal layer, and a thickness of the first dielectric layer.

16. The phase shifting device of claim 13, wherein the stacked structures disposed at different positions have different widths or thicknesses, and
wherein the phase shifting device has different refractive indices based on positions of the stacked structures in the phase shifting device.

17. The phase shifting device of claim 16, wherein the stacked structures having different widths or thicknesses are disposed such that the phase shifting device is a symmetrical planar lens or an asymmetric planar aspheric lens.

18. The phase shifting device of claim 13, wherein widths of the plurality of stacked structures gradually increase or decrease from a center of the phase shifting device to an edge of the phase shifting device.

19. The phase shifting device of claim 1, wherein a thickness of the metal layer ranges from 5 nm to 20 nm.

20. The phase shifting device of claim 1, wherein a thickness of the first dielectric layer ranges from 2.5 nm to 15 nm.

21. The phase shifting device of claim 1, wherein a sum of a thickness of one metal layer and a thickness of one first dielectric layer is 30 nm or less.

22. The phase shifting device of claim 1, wherein a width of the stacked structure ranges from 30 nm to 110 nm.

23. The phase shifting device of claim 1, wherein a width of the second dielectric layer ranges from 20 nm to 50 nm, and
wherein a sum of a width of the stacked structure and a width of the second dielectric layer ranges from 50 nm to 200 nm.

24. The phase shifting device of claim 1, wherein a first dielectric constant of the first dielectric layer is less than 20 and a second dielectric constant of the second dielectric layer is greater than 30.

25. The phase shifting device of claim 24, wherein the first dielectric layer comprises at least one of $SiO_2$, $Al_2O_3$, $Si_3N_4$, $Na_2SO_4$, $Sr_3(PO_4)_2$, $YAlO_3$, $MgSiO_3$, $YOCl$, $CaB_4O_7$, $Al_2MgO_4$, $Ba_2SiO_4$, $B_2O_3$, $Mg_4O_3(OH)_2$, $Ba_3P_4O_{13}$, $Li_3OBr$, $Mg(OH)_2$, $Y_2(Si_2O_7)$, $AlLiO_2$, $YOF$, $Ba_3(PO_4)_2$, $SrB_4O_7$, $BaSO_4$, and poly(methyl methacrylate).

26. The phase shifting device of claim 24, wherein the second dielectric layer comprises at least one of $TiO_2$, $HfO_2$, $ZrO_2$, $ZnO$, $SrTiO_3$, $GaN$, $GaP$, $BeO$, $NbOCl_3$, $NaNbO_3$, $NaTaO_3$, $AgTaO_3$, $Li_4CO_4$, $CdTiO_3$, $KTaO_3$, $Y_2Ti_2O_7$, $Cd_2Ta_2O_7$, $PbHfO_3$, $AlO(OH)$, $SrHfO_3$, $Ag_2Ta_4O_{11}$, $BaZrO_3$, $PbZrO_3$, $NaIO_3$, $BiTaO_4$, $HfTe_3O_8$, $K_2W_2O_7$, and $Sr_2Ta_2O_7$.

27. The phase shifting device of claim 1, wherein the metal layer comprises at least one of aluminum (Al), silver (Ag), gold (Au), and copper (Cu).

28. A chromatic aberration optical device comprising a phase shifting device, wherein the phase shifting device comprises:
a stacked structure comprising a metal layer and a first dielectric layer, the metal layer and the first dielectric layer being alternately stacked in a vertical direction; and
a second dielectric layer disposed on a side surface of the stacked structure in a horizontal direction,
wherein the first dielectric layer comprises a first material having a first dielectric constant and the second dielectric layer comprises a second material having a second dielectric constant,
wherein the first material is different from the second material, and
wherein the second dielectric constant is greater than the first dielectric constant.

29. The chromatic aberration optical device of claim 28, being configured as a flat lens or a flat beam deflector in a visible light or near infrared region.

30. The chromatic aberration optical device of claim 28, wherein a first dielectric constant of the first dielectric layer is less than 20 and a second dielectric constant of the second dielectric layer is greater than 30.

* * * * *